US010795346B2

(12) United States Patent
Yennie et al.

(10) Patent No.: US 10,795,346 B2
(45) Date of Patent: Oct. 6, 2020

(54) MACHINE LEARNING SYSTEMS FOR MONITORING OF SEMICONDUCTOR PROCESSING

(71) Applicants: Graham Yennie, Wexford, PA (US); Benjamin Cherian, San Jose, CA (US)

(72) Inventors: Graham Yennie, Wexford, PA (US); Benjamin Cherian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/297,517

(22) Filed: Mar. 8, 2019

(65) Prior Publication Data
US 2019/0286075 A1     Sep. 19, 2019

Related U.S. Application Data

(60) Provisional application No. 62/642,497, filed on Mar. 13, 2018.

(51) Int. Cl.
*H01L 21/306* (2006.01)
*G05B 19/418* (2006.01)
(Continued)

(52) U.S. Cl.
CPC ........ *G05B 19/4188* (2013.01); *B24B 37/013* (2013.01); *G05B 13/027* (2013.01); *G06N 3/0454* (2013.01); *G06N 3/084* (2013.01); *H01L 21/30625* (2013.01); *H01L 21/67092* (2013.01); *H01L 21/67253* (2013.01);
(Continued)

(58) Field of Classification Search
CPC ......... H01L 21/67092; H01L 21/67253; H01L 22/12; G05B 19/4063
See application file for complete search history.

(56) References Cited

U.S. PATENT DOCUMENTS

7,001,243 B1    2/2006  Yi et al.
2003/0055526 A1  3/2003  Avanzino et al.
(Continued)

OTHER PUBLICATIONS

PCT International Search Report and Written Opinion in International Appln. No. PCT/US2019/021441, dated Jun. 17, 2019, 11 pages.

*Primary Examiner* — Vincent H Tran
(74) *Attorney, Agent, or Firm* — Fish & Richardson P.C.

(57) ABSTRACT

Operating a substrate processing system includes receiving a plurality of sets of training data, storing a plurality of machine learning models, storing a plurality of physical process models, receiving a selection of a machine learning model from the plurality of machine learning models and a selection of a physical process model from the plurality of physical process models, generating an implemented machine learning model according to the selected machine learning model, calculating a characterizing value for each training spectrum in each set of training data thereby generating a plurality of training characterizing values with each training characterizing value associated with one of the plurality of training spectra, training the implemented machine learning model using the plurality of training characterizing values and plurality of training spectra to generate a trained machine learning model, and passing the trained machine learning model to a control system of the substrate processing system.

20 Claims, 4 Drawing Sheets

(51) Int. Cl.
  *G05B 13/02*  (2006.01)
  *G06N 3/08*  (2006.01)
  *H01L 21/67*  (2006.01)
  *H01L 21/66*  (2006.01)
  *B24B 37/013*  (2012.01)
  *G06N 3/04*  (2006.01)

(52) U.S. Cl.
  CPC .... *H01L 22/12* (2013.01); *G05B 2219/32335* (2013.01); *G05B 2219/45031* (2013.01)

(56) References Cited

U.S. PATENT DOCUMENTS

| | | |
|---|---|---|
| 2005/0171626 A1 | 8/2005 | Schwarm |
| 2010/0094790 A1 | 4/2010 | Gnojewski |
| 2010/0129939 A1 | 5/2010 | David et al. |
| 2014/0229409 A1 | 8/2014 | Kaushal et al. |
| 2014/0242880 A1 | 8/2014 | David |
| 2016/0148850 A1 | 5/2016 | David |
| 2017/0287751 A1* | 10/2017 | Kuznetsov ........ H01L 21/67253 |
| 2017/0351952 A1 | 12/2017 | Zhang et al. |
| 2018/0082826 A1 | 3/2018 | Guha et al. |
| 2018/0114140 A1 | 4/2018 | Chen et al. |
| 2018/0358271 A1* | 12/2018 | David .................... H01L 22/20 |
| 2019/0240799 A1* | 8/2019 | Takeda .................. H01L 21/304 |
| 2019/0286111 A1 | 9/2019 | Yennie et al. |
| 2020/0026196 A1* | 1/2020 | Luo ........................ G03F 7/705 |
| 2020/0101579 A1* | 4/2020 | Suzuki .................... B24B 51/00 |

* cited by examiner

MACHINE LEARNING SYSTEMS FOR MONITORING OF SEMICONDUCTOR PROCESSING

CROSS-REFERENCE TO RELATED APPLICATIONS

This application claims priority to U.S. Patent Application Ser. No. 62/642,497, filed on Mar. 13, 2018, the disclosure of which is incorporated by reference.

TECHNICAL FIELD

The present disclosure relates to machine learning systems used in monitoring of a substrate, e.g., during processing such as chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For some applications, the filler layer is planarized until the top surface of a patterned layer is exposed. For example, a conductive filler layer can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, the filler layer is planarized until a predetermined thickness is left over an underlying layer. For example, a dielectric layer deposited can be planarized for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable profile, e.g., a substrate layer that has been planarized to a desired flatness or thickness, or a desired amount of material has been removed. Variations in the initial thickness of a substrate layer, the slurry distribution, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed. Therefore, it may not be possible to determine the polishing endpoint merely as a function of the polishing time, or to achieve a desired profile merely by applying a constant pressure.

In some systems, a substrate is monitored in-situ during polishing, e.g., by an optical monitoring system. Thickness measurements from the in-situ monitoring system can be used to adjust pressure applied to the substrate to adjust the polishing rate and reduce within-wafer non-uniformity (WIWNU), and to detect the polishing endpoint and halt polishing.

SUMMARY

In one aspect, a method of operating a substrate processing system includes receiving a plurality of sets of training data, storing a plurality of machine learning models, storing a plurality of physical process models, receiving a selection of a machine learning model from the plurality of machine learning models and a selection of a physical process model from the plurality of physical process models to provide a combination of a selected machine learning model and a selected physical process model, generating an implemented machine learning model according to the selected machine learning model, calculating a characterizing value for each training spectrum in each set of training data thereby generating a plurality of training characterizing values with each training characterizing value associated with one of the plurality of training spectra, training the implemented machine learning model using the plurality of training characterizing values and plurality of training spectra to generate a trained machine learning model, and passing the trained machine learning model to a processing control system of the substrate processing system.

Each set of training data includes a plurality of training spectra, a timestamp for each training spectrum from the plurality of training spectra, and a starting characterizing value and/or an ending characterizing value for the plurality of training spectra. Each machine learning model provides at least one different hyperparameter. Each physical process model provides a different function to generate characterizing values as a different function of time and/or a different physical process parameter. The characterizing value is calculated based on the timestamp for the training spectrum, the starting characterizing value and/or ending characterizing value for the set of training data, and the selected physical process model.

In another aspect, a computer program product for controlling processing of a substrate is tangibly embodied in a computer readable media and includes instructions for causing a processor to receive a plurality of sets of training data, store a plurality of machine learning models, store a plurality of physical process models, receive a selection of a machine learning model from the plurality of machine learning models and a selection of a physical process model from the plurality of physical process models to provide a combination of a selected machine learning model and a selected physical process model, generate an implemented machine learning model according to the selected machine learning model, calculate a characterizing value for each training spectrum in each set of training data thereby generating a plurality of training characterizing values with each training characterizing value associated with one of the plurality of training spectra, train the implemented machine learning model using the plurality of training characterizing values and plurality of training spectra to generate a trained machine learning model, and pass the trained machine learning model to a processing control system of a substrate processing system.

Each set of training data including a plurality of training spectra, a timestamp for each training spectrum from the plurality of training spectra, and a starting characterizing value and/or an ending characterizing value for the plurality of training spectra. Each machine learning model provides at least one different hyperparameter. Each physical process model provides a different function to generate characterizing values as a different function of time and/or a different physical process parameter. The characterizing value is calculated based on the timestamp for the training spectrum, the starting characterizing value and/or ending characterizing value for the set of training data, and the selected physical process model.

In another aspect, a semiconductor fabrication system includes a plurality of polishing systems, an in-line or stand-alone metrology system, and an algorithm generation platform.

Each polishing system includes a support to hold a polishing pad, a carrier to hold a substrate against the polishing pad, a motor to cause relative motion between the substrate and the polishing pad, an in-situ monitoring system to generate a sequence of measurements of the substrate during polishing and a timestamp for each measurement in the sequence of measurements, and a controller. At least one controller of at least one of the plurality of polishing system is configured to cause one or more of the plurality of polishing systems to polish a series of training substrates. One or more controllers of one or more systems from the plurality of polishing systems are configured to receive a trained machine learning model, to cause the polishing system from the one or more systems to polish a series of device substrates, to receive a sequence of measurements of the device substrates from the in-situ monitoring system of the one or more systems, to generate a sequence of characterizing values based on the sequence of measurements and the trained machine learning model, and to control at least one polishing control parameter of based on the sequence of characterizing values.

The in-line or stand-alone metrology system is configured to generate a starting characterizing value and/or an ending characterizing value for each of the series of training substrates.

The algorithm generation platform comprises one or more processors and non-transitory computer readable media storing a computer program product having instructions for the one or more processors. A plurality of training spectra generated during polishing of the training substrate and a timestamp for each training spectrum from the plurality of training spectra is received, for each training substrate, from the in-situ monitoring system of one or more of the plurality of polishing systems used to polish the training substrate. The starting characterizing value and/or an ending characterizing value for the training substrate is received, for each training substrate, from the in-line or stand-alone metrology system. A plurality of sets of training data is stored. Each set of training data includes the plurality of training spectra from the training substrate, the timestamp for each training spectrum from the plurality of training spectra, and the starting characterizing value and/or an ending characterizing value for the training substrate. A plurality of machine learning models are stored, each machine learning model providing at least one different hyperparameter. A plurality of physical process models are stored, each physical process model providing a different function to generate characterizing values as a different function of time and/or a different physical process parameter. A selection of a machine learning model from the plurality of machine learning models and a selection of a physical process model from the plurality of physical process models is received to provide a combination of a selected machine learning model and a selected physical process model. At least one hyperparameter value is received for the selected machine learning model and at least one physical parameter value is received for the selected physical process model. An implemented machine learning model is generated according to the selected machine learning model and the at least one hyperparameter value. For each training spectrum in each set of training data, a characterizing value is calculated based on the timestamp for the training spectrum, the starting characterizing value and/or ending characterizing value for the set of training data, the physical parameter value, and the selected physical process model, thereby generating a plurality of training characterizing values with each training characterizing value associated with one of the plurality of training spectra. The implemented machine learning model is trained using the plurality of training characterizing values and plurality of training spectra to generate a trained machine learning model, and the trained machine learning model is passed to the controller of the one or more polishing systems for control of polishing of the device substrates.

Implementations may include one or more of the following features.

The substrate processing system may include a chemical mechanical polishing system. A substrate may be polished in the polishing system. During polishing of the substrate, the substrate may be monitored with an in-situ spectrographic monitoring system to generate the plurality of measured spectra. The plurality of measured spectra may be passed to the trained machine learning model to generate a plurality of characterizing values. At least one processing parameter of the polishing system may be controlled based on the plurality of characterizing values, e.g., polishing may be halted and/or a carrier head pressure may be adjusted.

The plurality of machine learning models may include a convolutional neural network and a fully connected neural network. A hyperparameter may be a number of hidden layers in the neural network. At least one hyperparameter value may be received for the selected machine learning model. The implemented machine learning model may be generated according to the selected machine learning model and the at least one hyperparameter value.

Some of the plurality of physical process models may include a linear function of time and some of the plurality of physical process models may include a non-linear function of time. The plurality of physical process models may include different physical process parameters, e.g., one or more of pattern density, starting step height, critical step height, and process selectivity. A physical parameter value may be received, and the characterizing value may be calculated based on the physical parameter value. The algorithm generation platform may be configured to receive a plurality of training spectra from the training substrate, and the timestamp for each training spectrum from the plurality of training spectra, from each of two or more of the plurality of polishing systems.

The at least one of the plurality of polishing systems and the one or more systems from the plurality of polishing systems may include at least some of the same polishing systems. The algorithm generation platform may be configured to store data providing a plurality of trained machine learning models. The algorithm generation platform may be configured to receive or make a selection of one of plurality of trained machine learning models and pass the selected trained machine learning model to the controller.

A substrate tracking system may including one or more processors and non-transitory computer readable media for storing a computer program product comprising instructions to store data characterizing each of the plurality of device substrates. The algorithm generation platform may be configured to receive data characterizing a device substrate from the substrate tracking system, and may be configured to select a trained machine learning model from the plurality of trained machine learning models based on the characterizing data.

In another aspect, a method of operating a polishing system includes training a plurality of models using a machine learning algorithm to generate a plurality of trained models, each trained model configured to determine a characteristic value of a layer of a substrate based on a monitoring signal from an in-situ monitoring system of a semiconductor processing system. The plurality of trained models are stored, data indicating a characteristic of a substrate to be processed is received, one of the plurality of trained models is selected based on the data, and the selected trained model is passed to the processing system.

Implementations may include one or more of the following features.

The layer of the substrate may be processed in a semiconductor processing system. During processing of the layer, the substrate may be monitored with an in-situ monitoring system and a signal may be generated from the in-situ monitoring system. The signal may be passed to the trained model to generate a measure of the thickness of the layer. One or more control signals may be generated for the processing system based on the measure of thickness. The processing system may be a chemical mechanical polishing system and processing the layer may include polishing the layer. Monitoring the substrate may include monitoring with a spectrographic monitoring system, and the signal may include a sequence of spectra.

One or more hyperparameters of a model may be obtained. A raw predictive model may be generated based on the hyperparameters. Training data may be obtained for the model, and the raw predictive model may be trained using the training data to generate the model. The training data may include, for each training example of a plurality of training examples, a training plurality of input information items and a ground truth measure of thickness. Each ground truth measure of thickness may be generated by an in-line or stand-alone metrology system based on analyzing a particular polished layer. The in-line or stand-alone metrology system may include one or more of a four-point probe, an ellipsometric thickness sensor, and a transmission electron microscopic sensor.

The model may include a neural network. The artificial neural network may be trained by backpropagation using training data and known characteristic values.

Certain implementations may have one or more of the following advantages. The thickness of a layer on a substrate can be measured more accurately and/or more quickly. Within-wafer thickness non-uniformity and wafer-to-wafer thickness non-uniformity (WIWNU and WTWNU) may be reduced, and reliability of an endpoint system to detect a desired processing endpoint may be improved.

The details of one or more embodiments are set forth in the accompanying drawings and the description below. Other aspects, features, and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
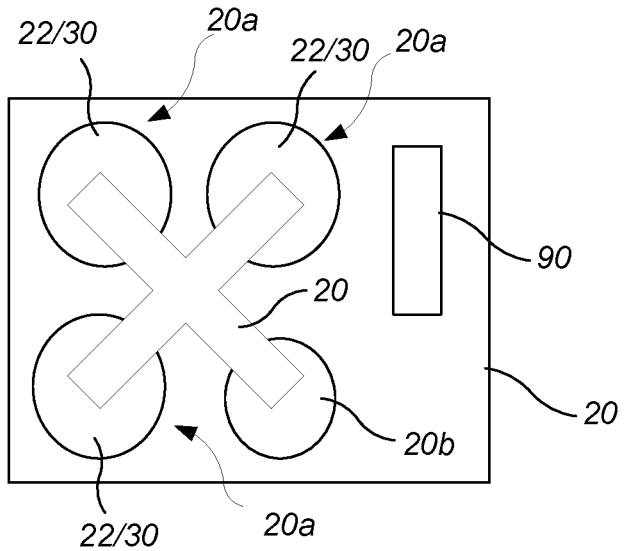
FIG. 1 illustrates a schematic plan view of a semiconductor fabrication plant.
Figure 1:
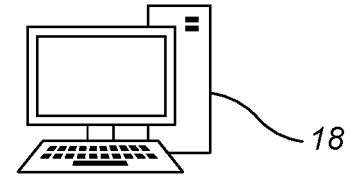
Figure 1:
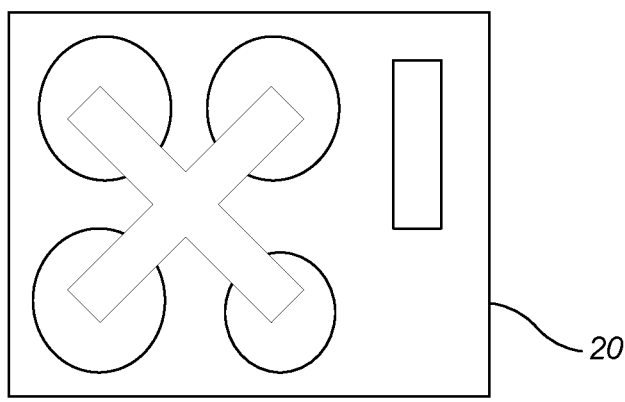
Figure 1:
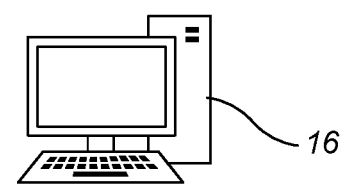
Figure 1:
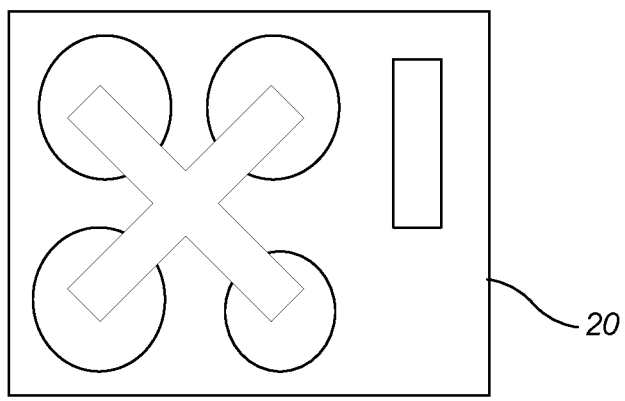
Figure 1:
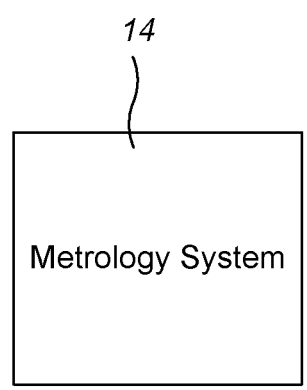

A variety of monitoring systems have been used to monitor substrates undergoing processing, e.g., polishing.

For some semiconductor monitoring processes, a machine learning system, e.g., a neural network, can be trained to evaluate data from a monitoring system and generate a needed output parameter. For example, a signal can be input to the machine learning system, and the machine learning system can output a thickness of a layer of the substrate, or a signal indicating that processing should be halted or modified.

As an example, if the monitoring system is a spectrographic monitoring system used during polishing of a substrate, then a spectrum or sequence of spectra can be input to the machine learning system, and the machine learning system can generate a measure of the thickness of a layer of the substrate or a signal indicating that polishing should be halted or that pressures of a carrier head should be modified.

Of course, such machine learning systems would need to be trained. Given the variety of devices and processing recipes, each of which can have different relationship of monitoring signal to substrate parameter, it may be impractical for a manufacturer of the processing system to train the machine learning system. Rather, it may be necessary for the machine learning system to be trained using data generated by the operator of the semiconductor fabrication plant. A generalized technique for storing and manipulating training data is discussed.

Different situations may need different machine learning models to process the data from the monitoring system. The different situations might include a differences in devices, in the layers being processed, in the history of processing parameters used in fabrication, etc. The different machine learning models might different neural network configurations, or models that do not use a neural network (e.g., genetic algorithms, support vector machines, etc.) versus models that do use a neutral network. A machine learning model can be selected based on input information about the substrate, e.g., information from a substrate tracking system of the fab.

As another issue, the raw data obtained from various tools in the semiconductor fabrication plant might not include a characterizing value for each measurement. For example, an in-situ optical monitoring system in a processing tool could be used to generate a sequence of spectra to be used as training data. However, the only ground truth measurement available may be the starting and/or ending thickness obtained from an in-line or stand-alone metrology system. The starting and/or ending thickness would be associated with the first and/or last spectrum in the sequence, but other spectra in the sequence (for intermediate times in the polishing process) would not have an associated thickness. A technique is needed to generate training values for these spectra.

A physical process model can be used to generate characterizing values as a function of processing time; these characterizing values can be associated with the spectra; this permits the spectra (with the characterizing values) to be used as training data. Different situations may need different physical process models to generate the characterizing values. The different situations might include differences in devices, in the layers being processed, in the history of processing parameters used in fabrication, etc. The different physical process models might use different inputs (e.g., a stop-on-film process can include the critical step height, whereas a process that stops polishing before exposure of the underlying layer may not need this variable), use different input values (e.g., different values for the pattern density or different selectivity), or use different functions to convert the variables to a characteristic value (e.g., a linear versus non-linear interpolation). A physical process model can be selected based on input information about the specific polishing process (e.g., prior experimental data collected with the polishing process), or information from a substrate tracking system of the fab.

FIG. 1 illustrates components of a semiconductor fabrication plant 12. The plant 12 can include one or more semiconductor processing tools, e.g., deposition systems, etching systems, polishing systems, etc. For example, the plant can include one or more polishing systems 20. Each polishing system 20 can include one or more polishing stations 20a and a transfer station 20b for transferring substrates to be polished into or out the polishing system 20. Each polishing station 20a includes an in-situ monitoring system 70 (see FIG. 2), e.g., a spectrographic monitoring system.

The plant 12 can also include an in-line or stand-alone metrology system capable of generating accurate measurements of a characteristic of interest for the substrate, e.g., a thickness of a layer on the substrate. This accurate measurement of the substrate characteristic can be termed a "ground truth measure." Examples of systems that can be used to generate the ground truth measure include a four-point probe, an ellipsometric sensor, or a transmission electron microscope. The in-line or stand-alone metrology system 14 can also generate other measurements, e.g., spectral measurements of one or more spots on the substrate, or images of the substrate. In some implementations, the metrology system 14 does not generate a value for a physical characteristic of the substrate, but rather a value that represents a degree of progress through a processing operation, e.g., a polishing operation.

The metrology system 14 can be used to measure a substrate before and/or after being processed by a processing tool, e.g., a polishing system 20. For example, the metrology system 14 can be used to generate measurements of thickness of a layer on a substrate before and after polishing of the substrate in a polishing system 20. This can provide a ground truth measure of the pre-polishing thickness and a post-polishing thickness of the substrate.

The plant 12 can also include a substrate tracking system 16 that tracks identifying information for the substrate, e.g., an id number for the substrate, an id number for a cassette that holds the substrate. The substrate tracking system can also store an indication of the eventual purpose of the substrate, e.g., the type of device being fabricated, and/or the processing history of the substrate, e.g., the processing parameters used at one or more of the steps of fabrication. The substrate tracking system 16 can be implemented with software executed on one or more computers, e.g., using one or more databases.

The substrate tracking system 16 can also store one or more intended values for one or more physical parameters of the substrate or the process to be performed on the substrate. For example, the substrate tracking system 16 could store one or more of a pattern density of the substrate, a starting step height for the substrate, a critical step height (the step height at which removal rate begins to slow down) for the substrate, or a process selectivity (the ratio of removal rates for different materials) for the polishing operation.

The plant 12 can also include an algorithm generation platform 18, which will be discussed in further detail below. The algorithm generation platform includes software executed on one or more computers to train a machine learning system. Training of the system generates an instantiation of a machine learning model. The instantiation of the machine learning model, e.g., hyperparameter values, can be passed to a process controller for processing system, e.g., a controller 90 for a polishing system 20. The hyperparameter values can indicate the machine learning model, e.g., whether neural network is convolutional or fully connected, the number of hidden layers of nodes in the neural network, the number of dimensions to which the spectra should be reduced, or the training metric.

The processing tool can use the trained model to generate a characteristic value based on measurements by the in-situ monitoring system. These characteristic values can then be used to control operation of the processing system, e.g., to halt processing or adjust a processing parameter to provide improved processing uniformity. For example, the polishing system can use the trained model to convert a spectrum from the in-situ monitoring system to a thickness value, which can be used to detect the polishing endpoint or determine an adjustment for a pressure in a carrier head.

Although illustrated as part of a single plant, the metrology system 14, substrate tracking system 16, and algorithm generation platform 18 need not be in the same physical location as each other or as the processing tool. In addition, the substrate tracking system 16 and algorithm generation platform 18 can be implemented with cloud computing techniques.

Figure 2:
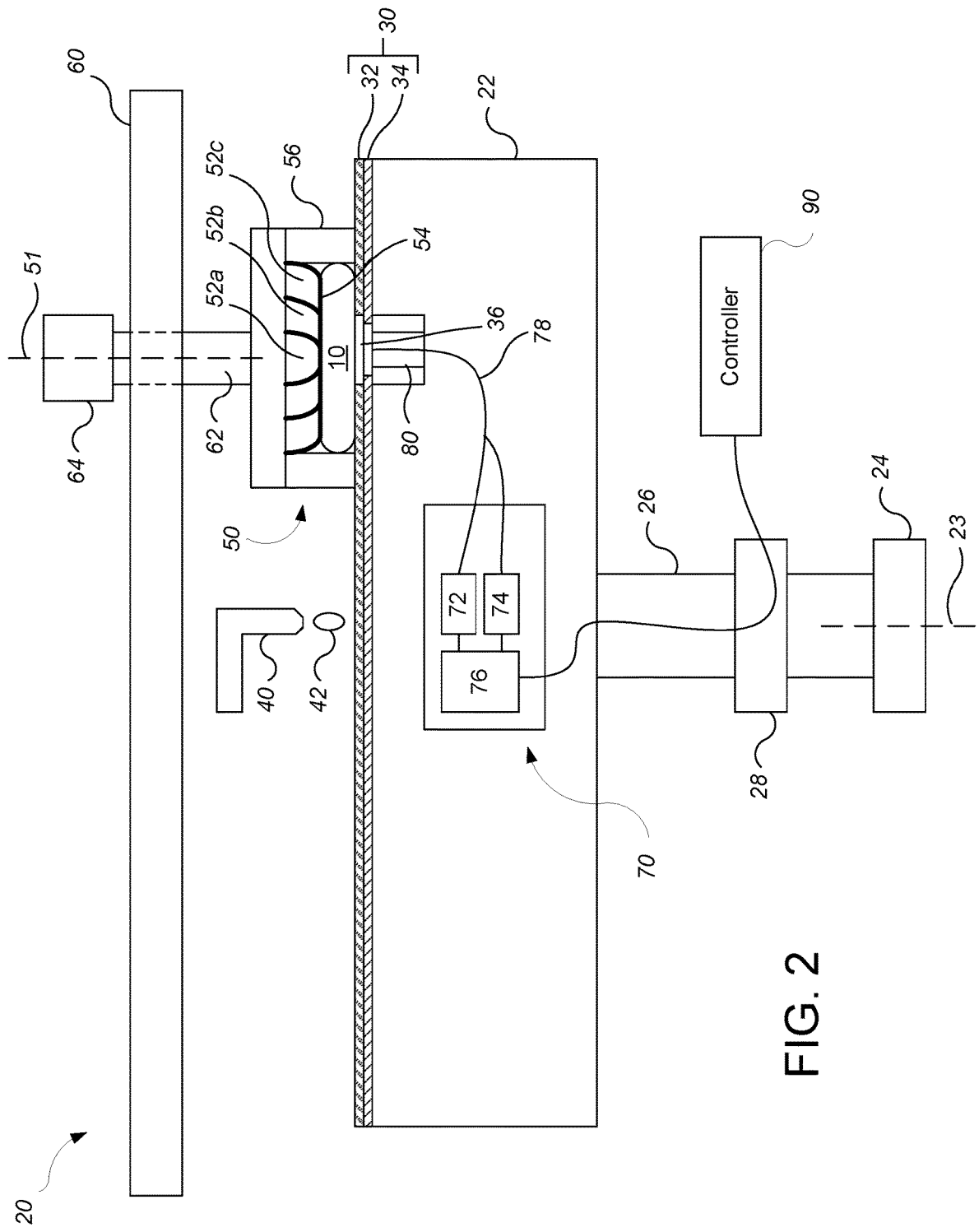
FIG. 2 illustrates a schematic cross-sectional view of an example of a polishing system.

FIG. 2 illustrates an example of a polishing station of a polishing system 20. The polishing system 20 can include a rotatable disk-shaped platen 22 on which a polishing pad 30 is situated. The platen is operable to rotate about an axis 23. For example, a motor 24 can turn a drive shaft 26 to rotate the platen 22. The polishing pad 30 can be detachably secured to the platen 22, for example, by a layer of adhesive. The polishing pad 30 can be a two-layer polishing pad with an outer polishing layer 32 and a softer backing layer 34.

The polishing system 20 can include a polishing liquid supply port 40 to dispense a polishing liquid 42, such as an abrasive slurry, onto the polishing pad 30. The polishing system 20 can also include a polishing pad conditioner to abrade the polishing pad 30 to maintain the polishing pad 30 in a consistent abrasive state.

A carrier head 50 is operable to hold a substrate 10 against the polishing pad 30. Each carrier head 50 also includes a plurality of independently controllable pressurizable chambers, e.g., three chambers 52a-52c, which can apply independently controllable pressurizes to associated zones on the substrate 10. The center zone can be substantially circular, and the remaining zones can be concentric annular zones around the center zone.

The chambers 52a-52c can be defined by a flexible membrane 54 having a bottom surface to which the substrate 10 is mounted. The carrier head 50 can also include a retaining ring 56 to retain the substrate 10 below the flexible membrane 54. Although only three chambers are illustrated in FIG. 2 for ease of illustration, there could be two chambers, or four or more chambers, e.g., five chambers. In addition, other mechanisms to adjust the pressure applied to the substrate, e.g., piezoelectric actuators, could be used in the carrier head 50.

Each carrier head 50 is suspended from a support structure 60, e.g., a carousel or track, and is connected by a drive shaft 62 to a carrier head rotation motor 64 so that the carrier head can rotate about an axis 51. Optionally each carrier head 50 can oscillate laterally, e.g., on sliders on the carousel, by motion along or track; or by rotational oscillation of the carousel itself. In operation, the platen 22 is rotated about its central axis 23, and the carrier head 50 is rotated about its central axis 51 and translated laterally across the top surface of the polishing pad 30.

The polishing system also includes an in-situ monitoring system 70, which can be used to control the polishing parameters, e.g., the applied pressure in one or more of the chambers 52a-52c, to control the polishing rate of one or more of the zones 12a-12c. The in-situ monitoring system 70 generates a signal indicative of the thickness of the layer being polished in each of the zones 12a-12c. The in-situ monitoring system can be an optical monitoring system, e.g., a spectrographic monitoring system.

The optical monitoring system 70 can include a light source 72, a light detector 74, and circuitry 76 for sending and receiving signals between a controller 90, e.g., a computer, and the light source 72 and light detector 74. One or more optical fibers can be used to transmit the light from the light source 72 to a window 36 in the polishing pad 30, and to transmit light reflected from the substrate 10 to the detector 74. For example, a bifurcated optical fiber 78 can be used to transmit the light from the light source 62 to the substrate 10 and back to the detector 74. As a spectrographic system, then the light source 72 can be operable to emit white light and the detector 74 can be a spectrometer.

The output of the circuitry 76 can be a digital electronic signal that passes through a rotary coupler 28, e.g., a slip ring, in the drive shaft 26 to the controller 90. Alternatively, the circuitry 76 could communicate with the controller 90 by a wireless signal. The controller 90 can be a computing device that includes a microprocessor, memory and input/output circuitry, e.g., a programmable computer. Although illustrated with a single block, the controller 90 can be a networked system with functions distributed across multiple computers.

In some implementations, the in-situ monitoring system 70 includes a sensor 80 that is installed in and rotate with the platen 22. For example, the sensor 80 could be the end of the optical fiber 78. The motion of the platen 22 will cause the sensor 80 to scan across the substrate. Due to the rotation of the platen, as the sensor 80 travels below the carrier head, the in-situ monitoring system makes measurements at a sampling frequency; as a result, the measurements are taken at locations 14 in an arc that traverses the substrate 10.

Over one rotation of the platen, spectra are obtained from different positions on the substrate 10. In particular, some spectra can be obtained from locations closer to the center of the substrate 10 and some can be obtained from locations closer to the edge. The controller 90 can be configured to calculate a radial position (relative to the center of the substrate 10) for each measurement from a scan based on timing, motor encoder information, platen rotation or position sensor data, and/or optical detection of the edge of the substrate and/or retaining ring. The controller can thus associate the various measurements with the various zones. In some implementations, the time of measurement can be used as a substitute for the exact calculation of the radial position.

The controller 90 can derive a characterizing value for each zone of the substrate based on the signal from the in-situ monitoring system. In particular, as polishing progresses, the controller 90 generates a sequence over time of characterizing values. The controller 90 can generate at least one characterizing value for each zone for each scan of the sensor below the substrate 10, or generate a characterizing value for each zone at a measurement frequency (which need not be the same as the sampling frequency), e.g., for polishing systems that do not scan the sensor across the substrate. In some implementations, a single characterizing value is generated per scan, e.g., multiple measurements can be combined to generate the characterizing value. In some implementations, each measurement is used to generate a characterizing value.

The characterizing value is typically the thickness of the outer layer, but can be a related characteristic such as thickness removed. In addition, the characterizing value can be a more generic representation of the progress of the substrate through the polishing process, e.g., an index value representing the time or number of platen rotations at which the measurement would be expected to be observed in a polishing process that follows a predetermined progress.

The controller 90 can use an instantiation of a model generated by a machine learning system to generate the characterizing values.

The combination of the in-situ spectrographic monitoring system 70 and the controller 90 can provide an endpoint and/or polishing uniformity control system 100. That is, the controller 90 can detect a polishing endpoint and halt polishing and/or adjust polishing pressures during the polishing process to reduce polishing non-uniformity, based on the series of characterizing values.

Figure 3:
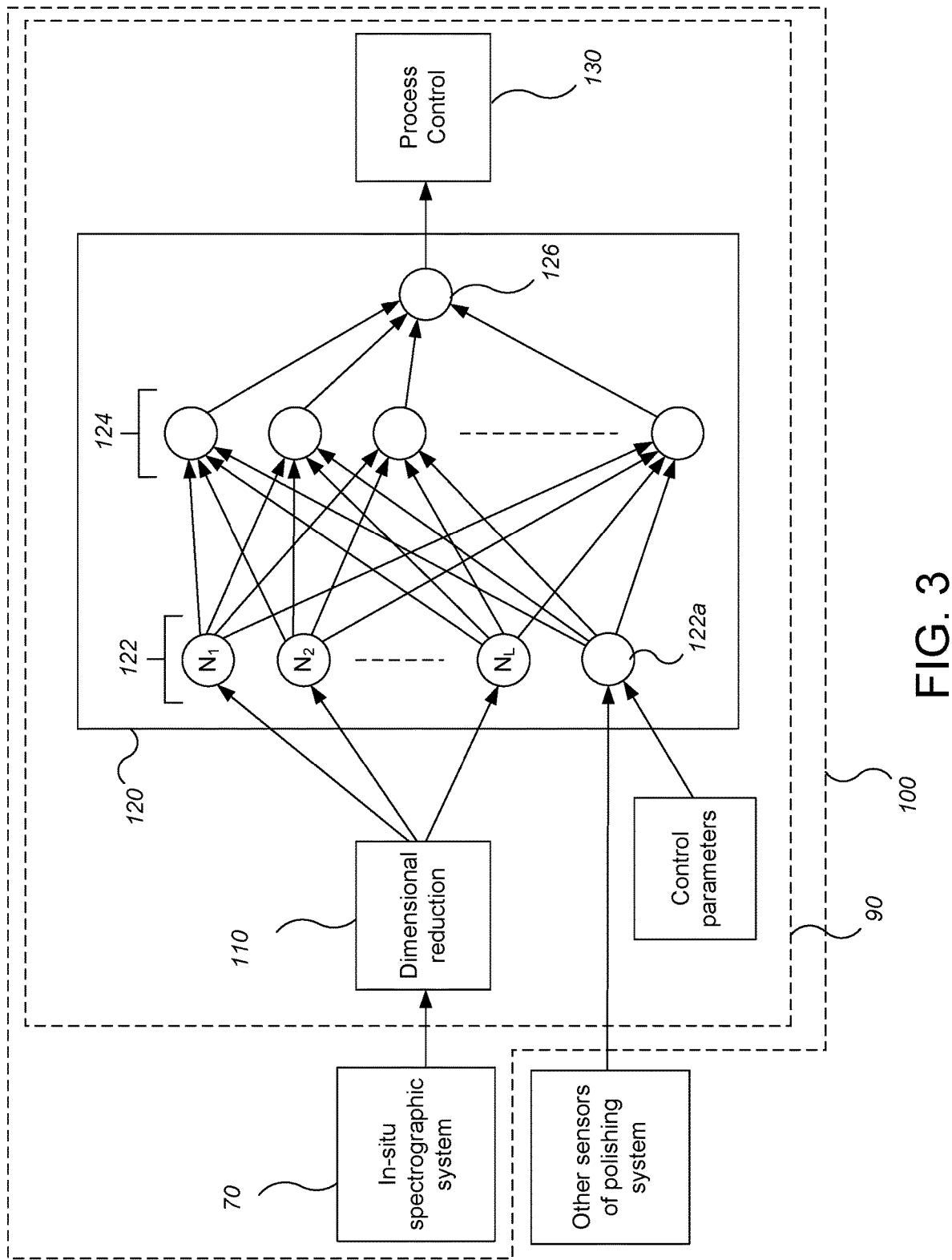
FIG. 3 illustrates is a neural network used as part of the controller for the polishing apparatus.

FIG. 3 illustrates functional blocks that can be implemented by the controller 90. These functional blocks can include an optional dimensional reduction module 110 to carry out dimensional reduction, a machine learning system (shown implemented as a neutral network) 120, and a process control system 130 to adjust the polishing process, e.g., detect a polishing endpoint and halt polishing and/or adjust polishing pressures during the polishing process to reduce polishing non-uniformity, based on the series of characterizing values. As noted above, these functional blocks can be distributed across multiple computers.

The neutral network 120 includes a plurality of input nodes 122 for each principal component, a plurality of hidden nodes 124 (also called "intermediate nodes" below), and an output node 126 that will generate the characteristic value. In a neural network having a single layer of hidden nodes, each hidden node 124 can be coupled to each input node 122, and the output node 126 can be coupled to each hidden node 220.

In general, a hidden node 124 outputs a value that a non-linear function of a weighted sum of the values from the input nodes 122 to which the hidden node is connected.

For example, the output of a hidden node 124, designated node k, can be expressed as:

$$\tan h(0.5 * a_{k1}(I_1) + a_{k2}(I_2) + \ldots + a_{kM}(I_M) + b_k) \qquad \text{Equation 1}$$

where tan h is the hyperbolic tangent, a is a weight for the connection between the $k^{th}$ intermediate node and the $x^{th}$ input node (out of M input nodes), and $I_M$ is the value at the $M^{th}$ input node. However, other non-linear functions can be used instead of tan h, such as a rectified linear unit (ReLU) function and its variants.

The optional dimensional reduction module 110 will reduce a measured spectrum to a more limited number of component values, e.g., L component values. The neural network 120 includes an input node 122 for each component into which the spectrum is reduced, e.g., where the module 110 generates L component values the neural network 120 will include at least input nodes $N_1, N_2 \ldots N_L$.

However, neural network 120 may optionally include one or more other input nodes (e.g., node 122a) to receive other data. This other data could be from a prior measurement of the substrate by the in-situ monitoring system, e.g., spectra collected from earlier in the processing of the substrate, from a measurement of a prior substrate, e.g., spectra collected during processing of another substrate, from another sensor in the polishing system, e.g., a measurement of temperature of the pad or substrate by a temperature sensor, from a polishing recipe stored by the controller that is used to control the polishing system, e.g., a polishing parameter such as carrier head pressure or platen rotation rate use for polishing the substrate, from a variable tracked by the controller, e.g., a number of substrates since the pad was changed, or from a sensor that is not part of the polishing system, e.g., a measurement of a thickness of an underlying films by a metrology station. This permits the neural network 120 to take into account these other processing or environmental variables in calculation of the characterizing value.

Before being used for, e.g., device wafers, the machine learning system 112 needs to be configured.

As part of a configuration procedure for the dimensional reduction module 110, the controller 90 can receive a plurality of reference spectra and a characterizing value, e.g., thickness, associated with each reference spectrum of the plurality of reference spectra. For example, reference spectra can be measured at particular locations on one or more test substrates. In addition, measurements of the thickness at the particular locations can be performed with metrology equipment, e.g., a contact profilometer or ellipsometer. A thickness measurement can thus be associated with the reference spectrum from the same location on a substrate. The plurality of reference spectra can include, for example, five to ten reference spectra.

Figure 4:
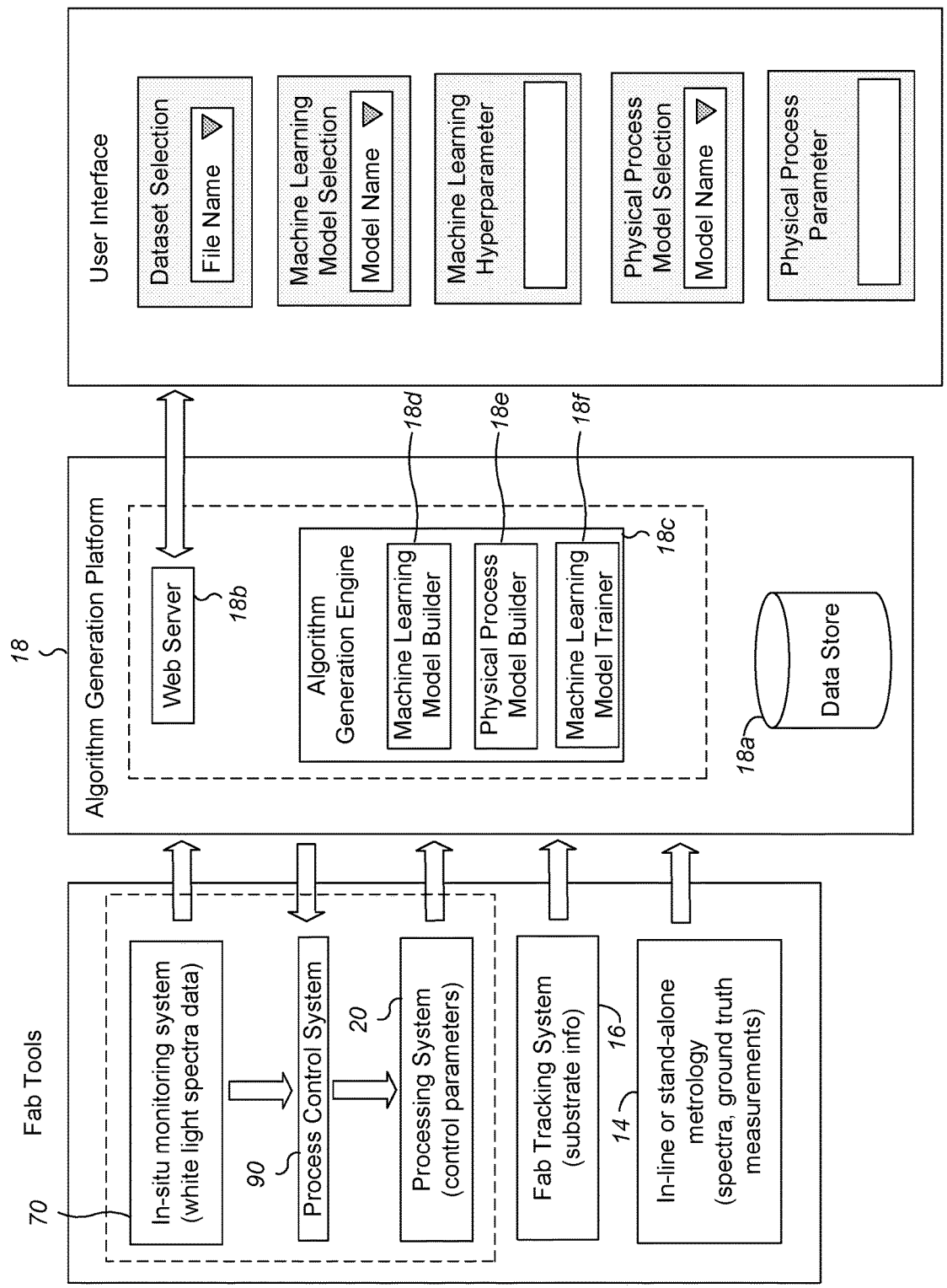
FIG. 4 illustrates an architecture of a platform for collecting data and generating models.

FIG. 4 illustrates the architecture of a platform for collecting data and generating models. The primary components include the fab tools, an algorithm generation platform, and a user interface.

The fab tools include the processing system, e.g., a chemical mechanical polisher 20. The processing system is controlled by various control parameters. Data to set the control parameters as a function of time can be termed a "recipe." For example, in a polishing system the control parameters can be set in a recipe that indicates polishing pressure in various chambers of the carrier head, as well as other parameters such as carrier head rotation rate, platen rotation rate, slurry dispensing rate, carrier head sweep, slurry composition, etc. Any of these control parameters can be specified as a function of time.

The fab tools also include the in situ monitoring system 70, although the monitoring system can be considered part of the processing system itself (shown by phantom box). The in-situ monitoring system 70 can be a spectrographic monitoring system as discussed above, although other sensors can be used instead or in addition, such as eddy current monitoring, motor current or torque monitoring, cameras, temperature sensors, etc.

The fab tools can also include a process controller, e.g., the controller 90, although the process controller can be considered part of the processing system itself (again shown by phantom box). The process controller receives data from the in-situ monitoring system 70 and controls the processing system 20. This control can be done generally in real time, e.g., as the substrate is being processed. For example, the process controller 90 can detect whether to halt processing, whether to adjust a process control parameter, or whether to start a new stage of a processing recipe. Adjusting the polishing parameter can include feeding new control parameter values to the processing system. For example, in a polishing system, the process control system can determine whether to adjust one or more pressures applied by the carrier head; the adjusted values can be passed to the processing system which then implements the adjusted process, e.g., applies the adjusted pressure.

The specific algorithm used by the process controller 90 can be received from the algorithm generation platform 18.

The algorithm generation platform 18 can be implemented as software running on one or more computers, e.g., in a server system. The algorithm generation platform 18 can have three primary functions.

First, the algorithm generation platform 18 is responsible for receiving data from various fab tools and storing that data in a data store 18a, e.g., a database. The data received can include the signal from the in-situ monitoring system (e.g., the sequence of spectra measured by a spectrographic monitoring system), the control parameters from the processing system (e.g., the polishing recipe), the substrate data from the fab substrate tracking system (e.g., the fabrication history of the substrate and/or identification of the device being fabricated), and the ground truth measure, and optionally other measurements from the metrology system.

In particular, the algorithm generation platform 18 can receive and store a plurality of sets of training data in the data store 18a. Each set of training data can correspond to a single processing operation on a single substrate. The substrate can be a substrate intentionally used for training, or a device substrate being monitoring in the usual course of fabrication of integrated circuits and for which a starting thickness value and/or an ending thickness value were measured by the metrology system.

For example, as or after a polishing system 20 polishes a substrate and the metrology system 14 measures the layer thickness of the substrate, data can be collected to form a set of training data. The collected data can include the spectra measured during polishing, the time in the polishing operation at which the spectrum was measured (a "timestamp"), and the ground truth measurement(s) made by metrology system. Thus, each set of training data can include a plurality of training spectra as measured by the spectrographic monitoring system, a timestamp for each training spectrum from the plurality of training spectra, and a starting thickness value and/or an ending thickness value for the plurality of training spectra.

Multiple sets of training data would typically be gathered from a single processing system, e.g., from a single polishing system. This processing system from which the training data is collected can be, but need not be, the same processing system for which the control algorithm will be generated. In some implementations, multiple sets of training data are collected from each of multiple processing systems, e.g., each of multiple polishing systems 20.

Second, the algorithm generation platform 18 can generate a user interface to permit the user, e.g., the operator of the semiconductor fabrication plant 12, to select various options discussed below. The user interface can be generated, e.g., through a web server 18b. Similarly, the user can access the user interface through a web browser. The web browser can be on the same computer or a different computer than the web server 18b.

Third, the algorithm generation platform 18 includes the algorithm generation engine 18c. The algorithm generation engine 18c includes several sub-components, including a machine learning model builder application 18d, a physical process model builder application 18e, and a model training application 18f.

The model builder application 18d permits the user to build various models of machine learning systems. For example, the model builder can permit a user to select a number of columns of hidden nodes in a neural network, or to specify connections or lack of connections between particular nodes in the neural network, to specify the non-linear function used by the neural network, etc. This permits the user to construct a variety of models that are particular to the processes performed by the user.

More particularly, the machine learning model builder 18*d* is configured to create multiple types of machine learning models. The different types of machine learning models can include neural networks, as well as machine learning models that do not use a neural network (e.g., random forests, gradient boosted trees, support vector machines, etc.). The different types of machine learning models can also include different neural network configurations, e.g., a convolutional neural network versus a fully connected neural network.

The machine learning model builder 18*d* can receive a selection of a machine learning model from the operator of the semiconductor fabrication plant, e.g., through the user interface. For example, the web server 18*b* can generate a web page that includes a graphical control element, e.g., a drop-down menu, checkbox, auto-completing search box, etc., that lists the multiple types of machine learning models and permits the operator to select one of the multiple types of machine learning models.

The machine learning model builder 18*d* can also receive one or more hyperparameter values from the operator of the semiconductor fabrication plant, e.g., through the user interface. The hyperparameter(s) are parameters that set the configuration of the machine learning model, and will depend on the type of machine learning model. The number of hidden layers in a neural network is an example of a hyperparameter for a neural network. Other examples include a percentage of dropout of nodes, the initializing weight, and the activation function. Again, the web server 18*b* can generate a web page that includes a graphical control element, e.g., a drop-down menu, checkbox, auto-completing search box, etc., that permits the operator to enter or select a value for each hyperparameter.

Once the machine learning model builder 18*d* has received the selection of the type of machine learning model and the, if necessary, any hyperparameter values, the machine learning model builder 18*d* can generate an instance of the machine learning model. At this point, the machine learning model is untrained, and thus not useful for actual calculation of characteristic values.

As noted above, a physical process model can be used to generate characterizing values as a function of processing time; these characterizing values can be associated with the spectra; this permits the spectra (with the characterizing values) to be used as training data.

The physical process machine learning model builder 18*d* is configured to create multiple types of physical process models. Each type of physical process model provides a function to generate thickness values as a different function of time and/or a different physical process parameter. The different types of physical process models can be distinguished based on (1) the basic function of the process model, e.g., linear or non-linear, (2) whether the output of the process model depends on physical process variables other than the timestamp and the starting and/or ending values, and (3) how other physical process variables are used in the physical process model.

For example, one type of a simple physical process model could be generation of a thickness value for a training spectrum by on linear interpolation between the starting value and ending value based on time of the training spectrum relative to the times of the first and last spectra of the sequence. This can be done without relying on other variables.

As another example, another type of physical process model could interpolation of a thickness value based on a pre-set non-linear function of time, e.g., without relying on other variables.

As another example, another type of physical process model could be to use a function that depends on the timestamp, the starting and/or ending values, and various physical process parameters, e.g., whether the process is stop on film, the process selectivity, the process initiation time, the pattern density on the substrate. Various physical process models are known in the art.

The physical process model builder 18*e* can receive a selection of a type of physical process model from the operator of the semiconductor fabrication plant, e.g., through the user interface. For example, the web server 18*b* can generate a web page that includes a graphical control element, e.g., a drop-down menu, checkbox, auto-completing search box, etc., that lists the multiple types of physical process models and permits the operator to select one of the multiple types of physical process models.

Although FIG. 4 illustrates separate control elements for the selection of the machine learning model and the physical process model, there could be a single control element, e.g., a drop-down menu, for simultaneous selection of an already paired machine learning model and physical process model.

The physical process model builder 18*e* can also receive one or more physical process parameter values from the operator of the semiconductor fabrication plant, e.g., through the user interface. Again, for a polishing operation, examples of the physical process parameters include the process selectivity, the process initiation time, the pattern density on the substrate. Again, the web server 18*b* can generate a web page that includes a graphical control element, e.g., a drop-down menu, checkbox, auto-completing search box, etc., that permits the operator to enter or select a value for each physical process parameter.

The model trainer application 18*f* permits the operator to select which data is to be used for training of a particular instantiation of a model. For example, assuming a spectrographic measurement system is to be used, the user can select which spectra from which substrates will be used for training, and the ground truth measurements associated with those spectra.

Assuming that the data store 18*a* stores multiple of sets of training data, the model trainer application 18*f* can receive a selection of a one or more of the sets of training data from the operator of the semiconductor fabrication plant, e.g., through the user interface. For example, the web server 18*b* can generate a web page that includes a graphical control element, e.g., a drop-down menu, checkbox, auto-completing search box, etc., that lists the data sets and permits the operator to select one or more of the data sets.

Once the physical process model builder 18*d* has received the selection of the type of physical process model and, if necessary, any process parameter values, the physical process model builder 18*d* can calculate a characteristic value, e.g., a thickness value, for each training spectrum that does not already have a characteristic value. That is, the various values, e.g., timestamp of the training spectrum, starting value, and ending value, are fed into the physical process model, which calculates a characteristic value for that training spectrum.

Once an instance of the physical process model has been created, the physical process model can be used to generate a characteristic value, e.g., a thickness value, for each training spectrum in the training data that does not already have a characterizing value. Training can be performed by the model trainer application 18f using conventional techniques. For example, for a neural network, training can be performed by backpropagation using the sequence of measurements and the characteristic values generated by the physical process model. For example, for training of a neural network can be performed by backpropagation using the sequence of spectra and the characteristic values, e.g., thickness values, generated by the polishing process model.

Once the training has been performed, the trained instantiation of the machine learning model can be passed to the process control system, which can then use the trained machine learning model as described above.

For example, during polishing of a substrate in the polishing system, the substrate can be monitored with an in-situ spectrographic monitoring system to generate a plurality of measured spectra of the substrate being polished. The plurality of measured spectra are passed to the trained machine learning model to generate a plurality of characterizing values, e.g., thickness measurements, and at least one processing parameter of the polishing system is controlled based on the plurality of characterizing values.

In particular, the algorithm generation platform can include instantiations of multiple types of machine learning models (e.g., models built with different architectures as described above), with the instantiations being trained by the same or a different data set. The algorithm generation platform can also include multiple instantiations of the same machine learning model, with each instantiation being trained by a different data set.

In some implementations, the user selects which trained model instantiation to load into the process control system. In some implementations, the algorithm generator can receive data from a fab tool and select a model instantiation based on that data. For example, the algorithm generator might receive data from the substrate tracking system that substrates in a cassette are being used for fabrication of a particular device. The algorithm generator can then select a model instantiation associated with that device, and pass that model instantiation to the process control system.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine-readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing system and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing system can be a linear polishing system, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used relative orientation or positioning of the components; it should be understood that the polishing surface and substrate can be held in a vertical orientation or some other orientation with respect to gravity.

Although the description above has focused on chemical mechanical polishing, the control system can be adapted to other semiconductor processing techniques, e.g., etching or deposition, e.g., chemical vapor deposition. In addition, the technique can be applied to an in-line or stand-alone metrology system rather than in-situ monitoring.

Particular embodiments of the invention have been described. Other embodiments are within the scope of the following claims.

What is claimed is:

1. A method of operating a substrate processing system, comprising:
receiving a plurality of sets of training data, each set of training data including a plurality of training spectra, a timestamp for each training spectrum from the plurality of training spectra, and a starting characterizing value and/or an ending characterizing value for the plurality of training spectra;
storing a plurality of machine learning models, each machine learning model providing at least one different hyperparameter;
storing a plurality of physical process models, each physical process model providing a different function to generate characterizing values as a different function of time and/or a different physical process parameter;
receiving a selection of a machine learning model from the plurality of machine learning models and a selection of a physical process model from the plurality of physical process models to provide a combination of a selected machine learning model and a selected physical process model;
receiving at least one hyperparameter value for the selected machine learning model and at least one physical parameter value for the selected physical process model;
generating an implemented machine learning model according to the selected machine learning model and the at least one hyperparameter value;

for each training spectrum in each set of training data, calculating a characterizing value based on the timestamp for the training spectrum, the starting characterizing value and/or ending characterizing value for the set of training data, the physical parameter value, and the selected physical process model, thereby generating a plurality of training characterizing values with each training characterizing value associated with one of the plurality of training spectra;

training the implemented machine learning model using the plurality of training characterizing values and plurality of training spectra to generate a trained machine learning model; and passing the trained machine learning model to a processing control system of the substrate processing system.

2. The method of claim 1, wherein the substrate processing system comprises a chemical mechanical polishing system.

3. The method of claim 2, further comprising:
polishing a substrate in the polishing system;
during polishing of the substrate, monitoring the substrate with an in-situ spectrographic monitoring system to generate a plurality of measured spectra;
passing the plurality of measured spectra to the trained machine learning model to generate a plurality of characterizing values; and
controlling at least one processing parameter of the polishing system based on the plurality of characterizing values.

4. The method of claim 3, wherein controlling the at least one processing parameter includes halting polishing and/or adjusting carrier head pressure.

5. A computer program product for controlling processing of a substrate, the computer program product tangibly embodied in a non-transitory computer readable media and comprising instructions for causing a processor to:
receive a plurality of sets of training data, each set of training data including a plurality of training spectra, a timestamp for each training spectrum from the plurality of training spectra, and a starting characterizing value and/or an ending characterizing value for the plurality of training spectra;
store a plurality of machine learning models, each machine learning model providing at least one different hyperparameter;
store a plurality of physical process models, each physical process model providing a different function to generate characterizing values as a different function of time and/or a different physical process parameter;
receive a selection of a machine learning model from the plurality of machine learning models and a selection of a physical process model from the plurality of physical process models to provide a combination of a selected machine learning model and a selected physical process model;
generate an implemented machine learning model according to the selected machine learning model;
for each training spectrum in each set of training data, calculate a characterizing value based on the timestamp for the training spectrum, the starting characterizing value and/or ending characterizing value for the set of training data, and the selected physical process model, thereby generating a plurality of training characterizing values with each training characterizing value associated with one of the plurality of training spectra;

train the implemented machine learning model using the plurality of training characterizing values and plurality of training spectra to generate a trained machine learning model; and pass the trained machine learning model to a processing control system of a substrate processing system.

6. The computer program product of claim 5, wherein the characterizing value comprises a thickness value for a layer on the substrate.

7. The computer program product of claim 5, wherein the plurality of machine learning models include a convolutional neural network and a fully connected neural network.

8. The computer program product of claim 7, wherein at least one different hyperparameter comprises a number of hidden layers in the neural network.

9. The computer program product of claim 5, wherein some of the plurality of physical process models include a linear function of time and some of the plurality of physical process models include a non-linear function of time.

10. The computer program product of claim 5, wherein the plurality of physical process models include different physical process parameters.

11. The computer program product of claim 5, wherein the physical process parameter includes one or more of pattern density, starting step height, critical step height, and process selectivity.

12. The computer program product of claim 5, comprising instructions to receive at least one hyperparameter value for the selected machine learning model, and wherein the instructions to generate the implemented machine learning model include instructions to generate the implemented machine learning model according to the selected machine learning model and the at least one hyperparameter value.

13. The computer program product of claim 5, comprising instructions to receive a physical parameter value for the selected physical process model, and wherein the instructions to calculate the characterizing value include instructions to calculate the characterizing value based on the physical parameter value.

14. A semiconductor fabrication system, comprising:
a plurality of polishing systems, each polishing system including a support to hold a polishing pad, a carrier to hold a substrate against the polishing pad, a motor to cause relative motion between the substrate and the polishing pad, an in-situ monitoring system to generate a sequence of measurements of the substrate during polishing and a timestamp for each measurement in the sequence of measurements, and a controller,
wherein at least one controller of at least one of the plurality of polishing system is configured to cause one or more of the plurality of polishing systems to polish a series of training substrates,
wherein one or more controllers of one or more systems from the plurality of polishing systems are configured to receive a trained machine learning model, to cause the polishing system from the one or more systems to polish a series of device substrates, to receive a sequence of measurements of the device substrates from the in-situ monitoring system of the one or more systems, to generate a sequence of characterizing values based on the sequence of measurements and the trained machine learning model, and to control at least one polishing control parameter of based on the sequence of characterizing values;

an in-line or stand-alone metrology system to generate a starting characterizing value and/or an ending characterizing value for each of the series of training substrates; and an algorithm generation platform comprising one or more processors and non-transitory computer readable media storing a computer program product comprising instructions for causing the one or more processors to receive, for each training substrate, from the in-situ monitoring system of one or more of the plurality of polishing systems used to polish the training substrate, a plurality of training spectra generated during polishing of the training substrate and a timestamp for each training spectrum from the plurality of training spectra, receive, for each training substrate, from the in-line or stand-alone metrology system, the starting characterizing value and/or an ending characterizing value for the training substrate, store a plurality of sets of training data, each set of training data including the plurality of training spectra from the training substrate, the timestamp for each training spectrum from the plurality of training spectra, and the starting characterizing value and/or an ending characterizing value for the training substrate, store a plurality of machine learning models, each machine learning model providing at least one different hyperparameter, store a plurality of physical process models, each physical process model providing a different function to generate characterizing values as a different function of time and/or a different physical process parameter, receive a selection of a machine learning model from the plurality of machine learning models and a selection of a physical process model from the plurality of physical process models to provide a combination of a selected machine learning model and a selected physical process model, receive at least one hyperparameter value for the selected machine learning model and at least one physical parameter value for the selected physical process model, generate an implemented machine learning model according to the selected machine learning model and the at least one hyperparameter value, for each training spectrum in each set of training data, calculate a characterizing value based on the timestamp for the training spectrum, the starting characterizing value and/or ending characterizing value for the set of training data, the physical parameter value, and the selected physical process model, thereby generating a plurality of training characterizing values with each training characterizing value associated with one of the plurality of training spectra, train the implemented machine learning model using the plurality of training characterizing values and plurality of training spectra to generate a trained machine learning model, and pass the trained machine learning model to the controller of the one or more polishing systems for control of polishing of the device substrates.

15. The system of claim 14, wherein the algorithm generation platform is configured to receive a plurality of training spectra from the training substrate, and the timestamp for each training spectrum from the plurality of training spectra, from each of two or more of the plurality of polishing systems.

16. The system of claim 14, wherein the at least one of the plurality of polishing systems and the one or more systems from the plurality of polishing systems include at least some of the same polishing systems.

17. The system of claim 14, wherein the algorithm generation platform is configured to store data providing a plurality of trained machine learning models.

18. The system of claim 17, wherein the algorithm generation platform is configured to receive or make a selection of one of plurality of trained machine learning models and pass the selected trained machine learning model to the controller.

19. The system of claim 18, further comprising a substrate tracking system including one or more processors and non-transitory computer readable media storing a computer program product comprising instructions to store data characterizing each of the device substrates.

20. The system of claim 19, wherein the algorithm generation platform is configured to receive characterizing data characterizing a device substrate from the substrate tracking system, and to select a trained machine learning model from the plurality of trained machine learning models based on the characterizing data.

* * * * *